United States Patent [19]
Nagano et al.

[11] Patent Number: 4,626,888
[45] Date of Patent: * Dec. 2, 1986

[54] GATE TURN-OFF THYRISTOR

[75] Inventors: Takahiro Nagano; Tsutomu Yatsuo; Saburo Oikawa, all of Hitachi; Akira Horie, Katsuta, all of Japan

[73] Assignee: Hitachi, Ltd., Tokyo, Japan

[*] Notice: The portion of the term of this patent subsequent to Sep. 17, 2002 has been disclaimed.

[21] Appl. No.: 550,586

[22] Filed: Nov. 10, 1983

[30] Foreign Application Priority Data

Nov. 10, 1982 [JP] Japan .................. 57-195921

[51] Int. Cl.$^4$ .................. H01L 29/74; H01L 23/48
[52] U.S. Cl. .................. 357/38; 357/68; 357/56
[58] Field of Search ............. 357/38, 386, 38 E, 38 C, 357/68, 56

[56] References Cited

U.S. PATENT DOCUMENTS 4,500,903  2/1985  Yatsuo et al. .................. 357/38
4,542,398  9/1985  Yatsuo et al. .................. 357/38

FOREIGN PATENT DOCUMENTS 50-7427    4/1975  Japan .................. 357/38 G
54-136186 10/1979  Japan .................. 357/38 E

OTHER PUBLICATIONS

Nagano et al., T. "Characteristics of a 3000V, 1000A Gate Turn-Off Thyristor" IAS Annual Meeting 1981, pp. 750-753.

Primary Examiner—Martin H. Edlow
Assistant Examiner—R. P. Limanek
Attorney, Agent, or Firm—Antonelli, Terry & Wands

[57] ABSTRACT

In accordance with the present invention, a plurality of strip-shaped emitter layers on the cathode side are radially arranged on one main surface of the semiconductor substrate while forming a plurality of rings. A gate electrode is in ohmic contact with a part of a base layer which surrounds and is adjacent to each of said emitter layers on the cathode side. Between rings formed by said emitter layers on the cathode side, a ring-shaped gate collecting electrode is provided to be connected to said gate electrode. The gate collecting electrode is provided at a position to balance the potential differences produced by gate currents respectively corresponding to inside and outside of said gate collecting electrode.

8 Claims, 8 Drawing Figures

GATE TURN-OFF THYRISTOR

The present invention relates to a gate turn-off (hereinafter referred to as GTO) thyristor, and in particular to a gate structure of a GTO thyristor having a higher interrupting current. A thyristor having a semiconductor substrate composed of four layers of p, n, p and n types is advantageous in that it is capable of controlling larger power as compared with a transistor having three layers of p, n and p types or n, p and n types. However, such a thyristor has a drawback that it cannot be switched from the "ON" state to the "OFF" state only by applying the gate signal.

A GTO thyristor can be turned off by only the gate signal because of the devised junction structures of the emitter layer on the cathode side whereon the cathode electrode is provided, of the second base layer which is adjacent to the emitter layer on the cathode side and on which the gate electrode is provided, and of the first base layer which is adjacent to said second base layer.

To be specific, the width of the emitter layer on the cathode side is narrowed to reduce the lateral resistance of the second base layer, whereby the gate signal extends to the central part of the emitter layer on the cathode side. In addition, the amount of carriers stored in the first and second base layers in the "ON" state is reduced to decrease the gate current required to turn off the GTO thyristor or the amount of charges extracted from the gate.

When the width of the emitter layer is narrowed, the conducting capacity cannot be increased. Accordingly, a number of narrow emitter layers on the cathode side are placed adjacent to the second base layer. In the second base layer, the gate electrode is so provided as to surround respective narrow emitter layers on the cathode layer. The number of narrow emitter layers placed in parallel is decided according to the current capacity of the GTO. Upon turning off, the current flowing through each narrow emitter layer on the cathode side is individually pulled out to be turned off by the gate signal. A region around each narrow emitter layer on the cathode side which is projected onto the emitter layer on the anode side may be viewed as a unit GTO element. That is to say, the GTO thyristor may be viewed as a complex composed of a plurality of unit GTO elements connected in parallel.

When a GTO thyristor having not only a high current capacity but also higher withstand voltage is to be realized, the peripheral shape of the semiconductor substrate is desired to be circular.

In an example illustrated in FIG. 1, a number of narrow emitter layers 5 on the cathode side are radially arranged in a quadruple ring form in a semiconductor substrate 1 having a peripheral circular shape. FIG. 2 is a schematic, sectional view of the GTO thyristor illustrated in FIG. 1 along a radial line II—II extending from the center of the semiconductor substrate 1 to the longitudinal center of an emitter layer 5 on the cathode side.

Referring to FIGS. 1 and 2, the semiconductor substrate 1 includes a p-type emitter layer 2 on the anode side, an n-type first base layer 3, a p-type second base layer 4, and an n-type narrow strip-shaped emitter layer 5 on the cathode side. The emitter layer 2 and the emitter shorting layer 6 are connected to an anode electrode 7 is an ohmic manner on the anode side which are exposed to the lower main surface. This structure of the emitter layer 2 is referred to as the shorted emitter. On the upper main surface side, a gate electrode 8 and a cathode electrode 9 are placed on the second base layer 4 and the emitter layer 5 on the cathode side respectively.

Reference numerals 80 and 90 denote a gate collecting electrode plate and a cathode buffer electrode plate, respectively, which are in pressurized contact with a gate electrode 8 and a cathode electrode 9 provided on the semiconductor substrate.

To be precise, the cathode electrode 9 is composed of divisions separately provided on respective emitter layers 5 on the cathode side. The gate electrode 8 is continuously arranged on the second base layer 4 so as to surround emitter layers 5 on the cathode side. The dotted circle A illustrated in FIG. 1 is a region where the gate collection electrode 80 is brought into pressurized contact with the gate electrode 8.

Every emitter layer 5 on the cathode side has an equal length and width. Each emitter layer 2 on the anode side is provided corresponding to each emitter layer 5 on the cathode side. Numeral reference 10 denotes a surface passivant. On the exposed surface on the cathode side of the semiconductor substrate 1, a silicon oxide film is provided as a surface passivant, which is not illustrated in the figures. In the main surface on the cathode side as illustrated in FIG. 2, a portion of the surface having the cathode electrode 9 thereon is projected from that having the gate electrode 8. To avoid complexity, however, the contour shape of unevenness is not illustrated in FIG. 1.

This prior art is disclosed in "Characteristics of a 30000 V, 1000 A Gate Turn-off Thyristor" IEEE, IAS, 1981 Annual Meeting. In FIGS. 1 and 2 as well as columns labelled "Device structure" and "Device design" on p. 750 in the above described literature, a "center gate" and "pressure contact" are described. In the anode emitter shorted GTO, the $n_E$ is radially arranged in the quadruple ring form and the $p_B$ is etched down. Emitter layers 5 on the cathode side are radially arranged while lying contiguous to each other in the circumference direction. When viewed from the top, the emitter layers 5 are arranged in the ring form. In FIG. 1, four rings are formed by emitter layers 5. The arrangement heretofore described is referred to as "radial arrangement in a quadraple ring form". In each ring, all of the emitter layers on the cathode side are arranged with equal pitches. It may be said that unit GTO elements are radially arranged in a quadruple ring form.

A gate terminal which is an external terminal is locally pressurized for contact by the gate collecting electrode plate 80. A cathode terminal and an anode terminal which are external terminals are entirely pressurized for contact respectively by the cathode buffer electrode plate 90 and the anode electrode 7. Since the cathode buffer electrode plate 90 and the anode electrode 7 may be made sufficiently large in thickness ($\gtrsim 1$ mm), their spreading resistance values in the lateral direction are negligible small. On the other hand, the gate electrode 8 is only 10 to 20 $\mu$m in thickness. Accordingly, the spreading resistance value in the lateral direction of the gate electrode 8 is comparatively high.

Since the gate collecting electrode plate 80 is placed at the center of the semiconductor substrate 1, the equivalent circuit of the GTO thyristor illustrated in FIG. 2 is represented in FIG. 3. In FIG. 3, $R_1$, $R_2$, $R_3$, and $R_4$ denote resistors between gates of unit GTO elements in the direction extending from the center to the periphery.

The operation of the GTO thyristor will now be described by using the equivalent circuit illustrated in FIG. 3. In the normal OFF state, a voltage is applied to a p-n junction 34 which is common to unit GTO elements and is formed by the n-type first base layer 3 and the p-type second base layer 4 as illustrated in FIG. 2. In the normal ON state, extra resistors are not provided in main current paths of unit GTO element, whereby the entire current is divided among unit GTO elements nearly equally.

During switching operations for turning on and off the GTO thyristor, a current flows between the gate terminal and the cathode terminal. Between gate terminals of unit GTO elements, resistors $R_1$ to $R_4$ are produced by the internal resistance (spreading resistance in the lateral direction) of the gate electrode 8. This makes a difference in gate drive power of unit GTO elements. In both turn-on and turn-off operations, a unit GTO element located near the gate collecting electrode plate 80 receives a larger gate drive power as compared with a unit GTO element located far from the gate collecting electrode plate 80 because of a potential difference generated in the gate electrode 8. A unit GTO element subjected to a larger gate drive power exhibits a faster switching speed. Therefore, a unit GTO element located nearer the gate collecting electrode plate 80 turns on and turns off faster than another unit GTO element located farther from the gate collecting electrode plate 80. Upon turning on, therefore, currents converge on a unit GTO element located near the gate collecting electrode plate 80. Upon turning off, currents converge on a unit GTO element located farther from the gate collecting electrode plate 80. If the density of the current thus converging to a limited part exceeds a particular critical value, the GTO thyristor is destroyed. Even if the number of unit GTO elements in the conventional GTO thyristor is increased, therefore, there is a limit in current which can be switched by the GTO thyristor. As a result, it was difficult to increase the current capacity.

An object of the present invention is to provide a GTO thyristor wherein a plurality of unit GTO elements equally turn on and off.

Another object of the present invention is to provide a GTO thyristor having a gate structure capable of a higher interrupting current.

In accordance with the present invention, in a GTO thyristor having a plurality of strip-shaped emitter layers on the cathode side radially arranged on one main surface of a circular semiconductor substrate around the center of the substrate while forming a plurality of rings, a ring-shaped gate collecting electrode plate is so provided between rings formed by emitter layers on the cathode side as to nearly balance potential differences produced within the gate electrode by gate currents collected respectively from unit GTO elements located on the center side and the external periphery side with respect to the gate collecting electrode plate into that gate.

Figure 1:
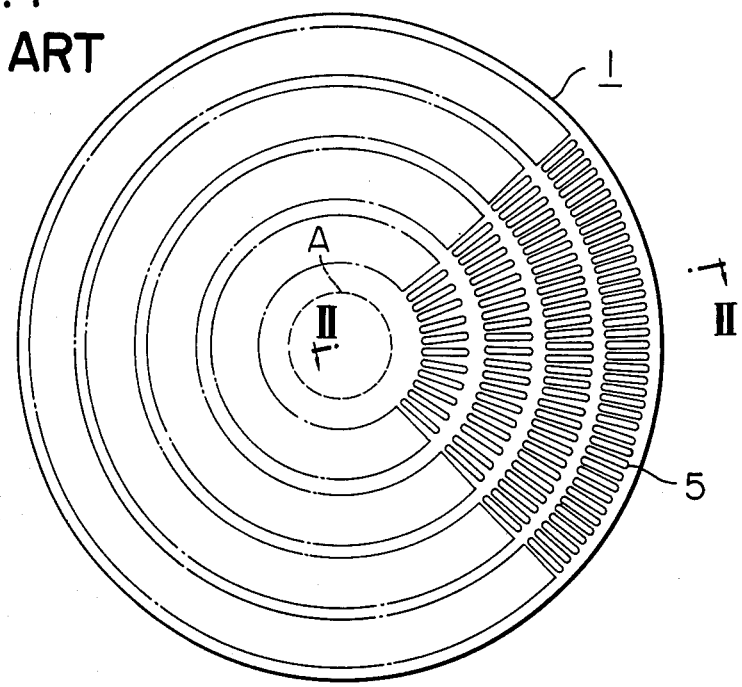
FIG. 1 is a partial plane view of the cathode side of a circular semiconductor substrate included in a conventional GTO thyristor.
Figure 2:
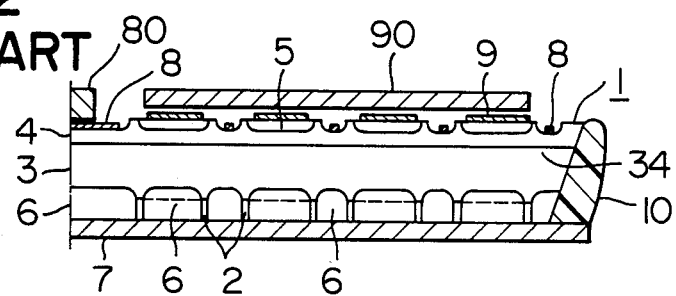
FIG. 2 is a vertical sectional view of the semiconductor substrate along the cutting line II—II illustrated in FIG. 1.
Figure 3:
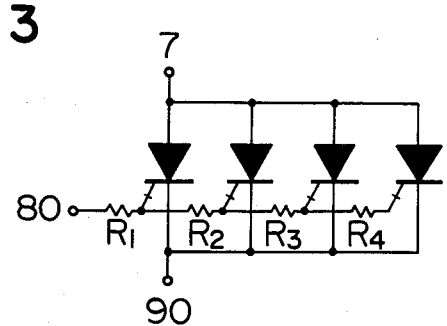
FIG. 3 is an equivalent circuit diagram of the GTO thyristor illustrated in FIG. 2.
Figure 4:
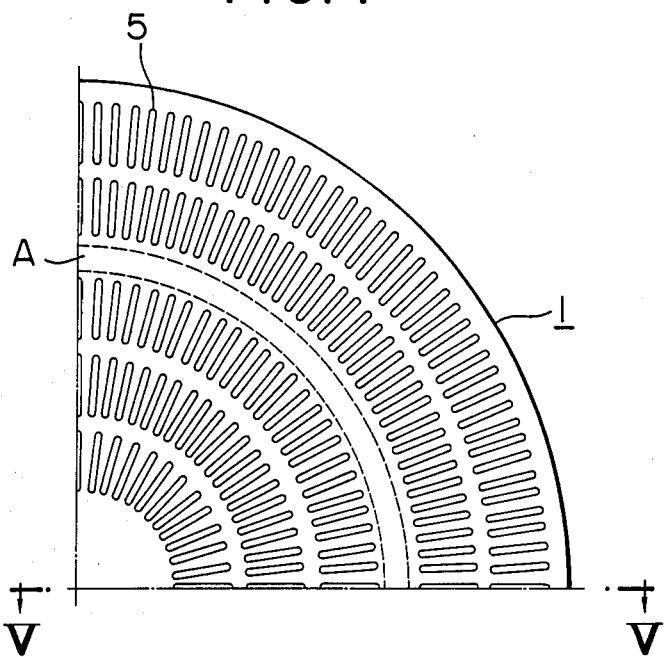
FIG. 4 is a partial plane view of the cathode side of a circular semiconductor substrate included in an embodiment of a GTO thyristor according to the present invention.
Figure 5:
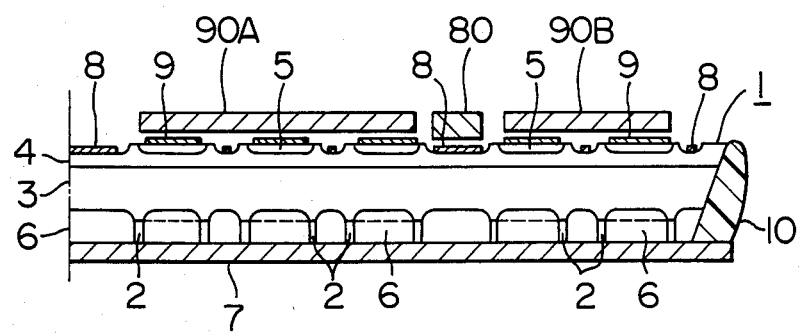
FIG. 5 is a vertical sectional view of the semiconductor substrate along a cutting line V—V illustrated in FIG. 4.

In FIGS. 4 and 5, the same numerals or symbols are provided to parts which are the same as or similar to those illustrated in FIGS. 1 and 2.

A circular semiconductor substrate 1 is 60 mm in diameter. Emitter layers 5 on the cathode side are radially arranged around the center of the semiconductor substrate 1 in the quintuplicate ring form. A ring-shaped gate collecting electrode plate 80 is brought into pressurized contact with a part of the gate electrode 8 existing between the third ring and the fourth ring when counted from the center. A cathode buffer electrode plate is divided into an internal plate 90A and an external plate 90B, both of which take the shape of ring. The gate collecting electrode 80 and cathode buffer electrode plates 90A and 90B are concentrically arranged. They are electrically isolated from each other and sometimes mechanically integrated. That is to say, they can be integrated and insulated by using an isolated material such as resin, glass or ceramics. An external cathode terminal is brought into contact with the cathode buffer electrode plates 90A and 90B. An external gate terminal is connected to the gate collecting electrode plate 80. This integration structure and connection method may be arbitrarily used. Unit GTO elements are divided into those located outside the gate collecting electrode plate 80 and those located inside the plate 80. Accordingly, it becomes possible to greatly reduce the distance from the gate collecting electrode plate 80 to the farthest unit GTO element as compared with the prior art illustrated in FIGS. 1 and 2. Thus, the potential difference within the gate electrode 8 is decreased. Accordingly, it becomes possible to reduce the difference among gate currents supplied to unit GTO elements, i.e., the difference among gate drive powers. Thereby, the difference among switching speed is also reduced. Therefore, it becomes possible to mitigate the current convergence at the time of switching and increase the current capacity of the entire GTO thyristor. The current convergence at the time of turning on may be further decreased because a large number of unit GTO elements are adjacent to the gate collecting electrode plate 80.

Figure 6:
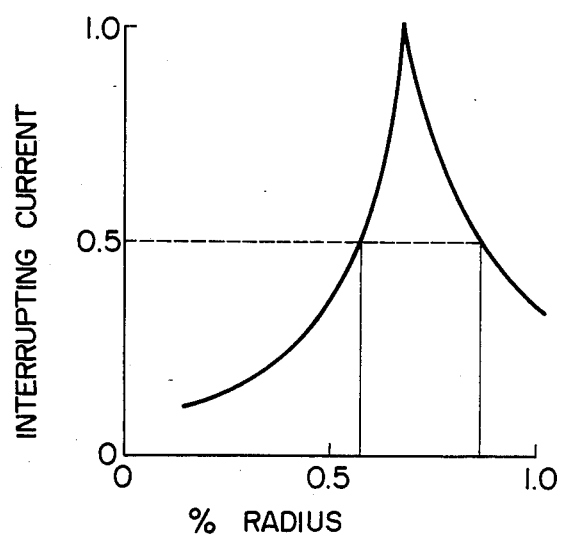
FIG. 6 shows the relationship between the radius of the semiconductor substrate and the cutoff current when one gate collecting electrode plate is provided in the middle part of the semiconductor substrate.

FIG. 6 shows the interrupting current when one ring-shaped gate collecting electrode plate is placed at various positions on the semiconductor substrate. The interrupting current may be maximized by providing one ring-shaped gate collecting electrode plate at a distance from the center which amounts to 67% of the radius of the semiconductor substrate. The ordinate value indicates the ratio of the interrupting current obtained when the ring-shaped gate collecting electrode plate is shifted in the radial direction with respect to the above described maximum interrupting current. The abscissa value indicates the ratio of the distance from the center to the gate collecting electrode plate with respect to the radius of the semiconductor substrate. The characteristic illustrated in FIG. 6 is common to various semiconductor substrates having different radii.

The reason why the gate collecting electrode plate located at a distance amounting to 67% of the radius yields the maximum interrupting capability will now be qualitatively explained. The number of unit GTO elements arranged in a ring among a plurality of rings provided on the circular semiconductor substrate is increased as the distance from the center of the circular semiconductor substrate to that ring is increased. Accordingly, with respect to the potential difference generated within the gate electrode by the flow of the gate current to be converged to the gate collecting electrode plate, the inside (center side) of the gate collecting electrode plate balances with the outside (outer periphery side) thereof.

As shown in FIG. 6, it is possible to ensure an interrupting current which is 50% or more of the maximum interrupting current by placing the ring-shaped gate connecting electrode plate at a distance from the center amounting to 57 to 86% of the radius of the semiconductor substrate.

In the embodiment illustrated in FIGS. 4 and 5, therefore, the center of the ring-shaped gate collecting electrode plate 80 is placed at a position corresponding to 67% of the radius of the semiconductor substrate 1.

In the embodiment of a GTO thyristor illustrated in FIG. 5, a current capacity exceeding twice that of the prior art has been realized.

Figure 7:
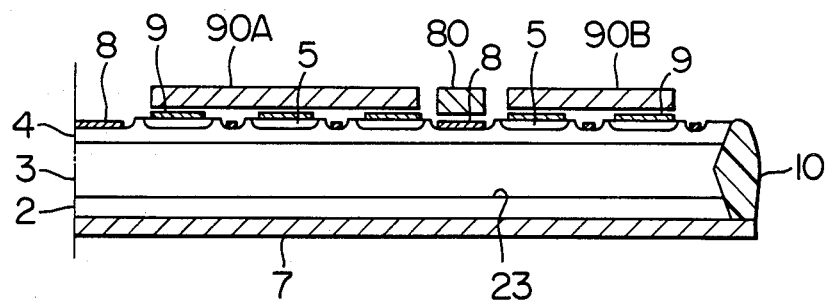
FIG. 7 is a partial, vertical sectional view of a circular semiconductor substrate included in another embodiment of a GTO thyristor according to the present invention.

The present invention may also be applied to a GTO thyristor of non-anode-emitter-shorted GTO thyristor. FIG. 7 shows an embodiment of a non-anode-emitter-shorted GTO thyristor according to the present invention. The same parts as or parts similar to those illustrated in FIGS. 4 and 5 are provided with the same reference symbols. Unlike the embodiment illustrated in FIG. 5, an emitter layer 2 on the anode side is not provided with an emitter shorting layer 6 (FIG. 5). A p-n junction 23 formed by the emitter layer 2 on the anode side and a first base layer 3 is not shunted by an anode electrode 7. The pattern on the cathode side is the same as that illustrated in FIG. 4. Whether the GTO thyristor to be used is the non-anode-emitter-shorted circuit type or anode-emitter-shorted circuit type depends upon means for reducing the amount of carriers stored in the base layer in the ON state. In the non-anode-emitter-shorted circuit type, a carrier lifetime killer such as gold is doped all over the semiconductor substrate 1. In the anode-emitter-shorted circuit type, the amount of carriers is reduced by the emitter shorting layer 6 on the anode side (FIG. 5).

The concept of the present invention may be easily applied to a semiconductor substrate having a still larger diameter by adding the gate collecting electrode plates provided midway.

Figure 8:
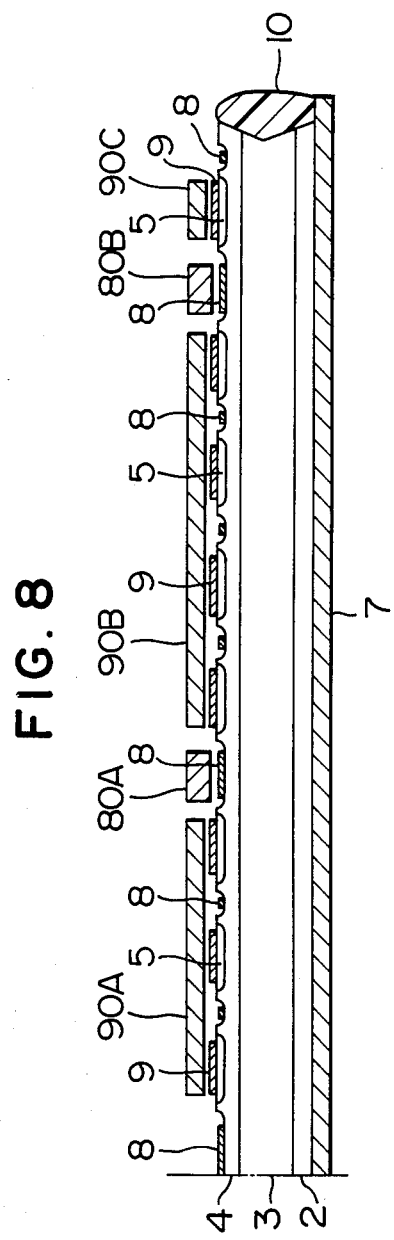
FIG. 8 is a partial, vertical sectional view of a circular semiconductor substrate included in still another embodiment of a GTO thyristor according to the present invention.

FIG. 8 shows an embodiment of the present invention having two ring-shaped gate collecting electrode plates 80A and 80B.

In FIG. 8, the same parts as or parts similar to those illustrated in FIG. 7 are provided with the same reference numerals.

A cathode electrode plate 90B is brought into contact with cathode electrodes 9 provided on four emitter layers on the cathode side. On the external periphery side of the gate collecting electrode plate 80B, another cathode electrode plate 90C is provided to be in contact with a cathode electrode 9 mounted on the most external emitter layer 5 of the semiconductor substrate 1.

In the same way as the embodiment illustrated in FIG. 4, emitter layers 5 on the cathode side are radially arranged, the emitter layers arranged in a circumference direction forming one of a plurality of rings.

When sequential numbers are assigned to rings arranged from the center of the semiconductor substrate 1 toward the periphery thereof, the gate collecting electrode plate 80A controls turn-on or turn-off operation of unit GTO elements included in the first to fifth rings. The gate collecting electrode 80B controls turn-on or turn-off operation of unit GTO elements included in the sixth to eighth rings. The number of rings processed by the gate collecting electrode plate 80B is selected to be smaller than that of rings processed by the gate collecting electrode plate 80A for the purpose of balancing potentials within the gate electrode 8. That is to say, unit GTO elements are arranged with equal pitches in the circumference direction of each ring. The number of unit GTO elements included in a ring is increased as the distance from the center to that ring is increased. Accordingly, as the distance from the center to that ring is increased, the potential drop within the gate electrode 8 is increased.

The present invention may be applied to not only an even number of rings but also an odd number of rings.

As described above, the present invention provides in-phase operation in a number of unit GTO elements arranged in the semiconductor substrate. Accordingly, it is possible to prevent abnormal convergence of current to limited unit GTO elements in turn-on and turn-off operation. As a result, a GTO thyristor having a large current capacity may be obtained.

We claim:
1. A gate turn-off thyristor comprising:
a circular semiconductor substrate having an emitter layer on the anode side, a first base layer, a second base layer, and an emitter layer on the cathode side, which has alternating conductivity types so as to form p-n junctions between adjacent layers, said emitter layer on the cathode side being composed of a plurality of separate individual emitter layers taking the shape of a long and narrow strip, said individual emitter layers on the cathode side being exposed onto one main surface of said semiconductor substrate together with said base layer and being arranged in the radial direction extending from the center of said semiconductor substrate toward the periphery thereof, while forming a plurality of rings on said one main surface;
cathode electrodes which respectively are in ohmic contact with respective strip-shaped individual emitter layers on the cathode side;
a gate electrode which is in ohmic contact with said second base layer exposed onto said one main surface of said semiconductor substrate and which surrounds said strip-shaped individual emitter layers on the cathode side;

an anode electrode which is at least in ohmic contact with said emitter layer on the anode side exposed to the other main surface of said semiconductor substrate;

cathode buffer electrode plates which are connected to said cathode electrodes; and a gate collecting electrode which is connected to said gate electrode and is so provided in a ring form between emitter layer rings that the potential differences produced within said gate electrode by gate currents which are collected respectively from the center side of said semiconductor substrate and the periphery side thereof in view of said gate collecting electrode approximately balance each other.

2. A gate turn-off thyristor according to claim 1, wherein said individual emitter layers on the cathode side are arranged in the radial direction while being adjacent to each other in the circumference direction and pitches between adjacent individual emitter layers in all of rings formed by said layers are equal.

3. A gate turn-off thyristor according to claim 1, wherein one gate collecting electrode is connected to a gate at a distance from the center of said semiconductor substrate, said distance corresponding to 57 to 86% of the radius of said semiconductor substrate.

4. A gate turn-off thyristor comprising:

a circular semiconductor substrate having an emitter layer on the anode side, a first base layer, a second base layer, and an emitter layer on the cathode side, which has alternating conductivity types so as to form p-n junctions between adjacent layers, said emitter layer on the cathode side being composed of a plurality of separate individual emitter layers taking the shape of a long and narrow strip, said individual emitter layers on the cathode side being exposed onto one main surface of said semiconductor substrate together with said base layer and being arranged in the radial direction extending from the center of said semiconductor substrate toward the periphery thereof, while forming more than two rings on said one main surface;

cathode electrodes which respectively are in ohmic contact with respective strip-shaped individual emitter layers on the cathode side;

a gate electrode which is in ohmic contact with said second base layer exposed onto said one main surface of said semiconductor substrate and which surrounds said strip-shaped individual emitter layers on the cathode side;

an anode electrode which is at least in ohmic contact with said emitter layer on the anode side exposed to the other main surface of said semiconductor substrate;

cathode buffer electrode plates which are connected to said cathode electrodes; and a gate collecting electrode which is connected to said gate electrode and is so provided in a ring form between emitter layer rings that the potential differences produced within said gate electrode by gate currents which are collected respectively from the center side of said semiconductor substrate and the periphery side thereof in view of said gate collecting electrode approximately balance each other.

5. A gate turn-off thyristor according to claim 4, wherein said individual emitter layers on the cathode side are arranged in the radial direction while being adjacent to each other in the circumference direction, and pitches between adjacent individual emitter layers in all of rings formed by said layers are equal.

6. A gate turn-off thyristor according to claim 4, wherein one gate collecting electrode is connected to a gate at a distance from the center of said semiconductor substrate, said distance corresponding to 57 to 86% of the radius of said semiconductor substrate.

7. A gate turn-off thyristor comprising:

a circular semiconductor substrate having an emitter layer on the anode side, a first base layer, a second base layer, and an emitter layer on the cathode side, which has alternating conductivity types so as to form p-n junctions between adjacent layers, said emitter layer on the cathode side being composed of a plurality of separate individual emitter layers taking the shape of a long and narrow strip, said individual emitter layers on the cathode side being exposed onto one main surface of said semiconductor substrate together with said base layer and being arranged in the radial direction extending from the center of said semiconductor substrate toward the periphery thereof, while forming more than two rings on said one main surface;

cathode electrodes which respectively are in ohmic contact with respective strip-shaped individual emitter layers on the cathode side;

a gate electrode which is in ohmic contact with said second base layer exposed onto said one main surface of said semiconductor substrate and which surrounds said strip-shaped individual emitter layers on the cathode side;

an anode electrode which is at least in ohmic contact with said emitter layer on the anode side exposed to the other main surface of said semiconductor substrate;

cathode buffer electrode plates which are connected to said cathode electrodes; and a plurality of radially separated gate collecting electrodes which are connected to said gate electrode and are so each provided in a ring form between emitter layer rings that the potential differences produced within said gate electrode by gate currents which are collected respectively from the center side of said semiconductor substrate and the periphery side thereof in view of said gate collecting electrodes approximately balance each other.

8. A gate turn-off thyristor according to claim 7, wherein said individual emitter layers on the cathode side are arranged in the radial direction while being adjacent to each other in the circumference direction, and pitches between adjacent individual emitter layers in all of rings formed by said layers are equal.

* * * * *